(12) United States Patent
Kumar et al.

(10) Patent No.: US 7,875,871 B2
(45) Date of Patent: Jan. 25, 2011

(54) HETEROJUNCTION DEVICE COMPRISING A SEMICONDUCTOR AND A RESISTIVITY-SWITCHING OXIDE OR NITRIDE

(75) Inventors: Tanmay Kumar, Pleasanton, CA (US); S. Brad Herner, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 501 days.

(21) Appl. No.: 11/395,419

(22) Filed: Mar. 31, 2006

(65) Prior Publication Data

US 2007/0228414 A1 Oct. 4, 2007

(51) Int. Cl.
*H04L 29/02* (2006.01)
*H04L 47/00* (2006.01)

(52) U.S. Cl. ............. 257/2; 257/4; 257/5; 257/E33.046
(58) Field of Classification Search ...................... 257/2, 257/4, 5, E33.046
See application file for complete search history.

(56) References Cited

U.S. PATENT DOCUMENTS

| | | | |
|---|---|---|---|
| 2,655,609 A | 10/1953 | Shockley | |
| 2,971,140 A | 12/1959 | Chappey et al. | |
| 3,796,926 A | 3/1974 | Cole et al. | |
| 4,204,028 A | 5/1980 | Donley | |
| 4,499,557 A | 2/1985 | Holmberg et al. | |
| 4,646,266 A | 2/1987 | Ovshinsky et al. | |
| 4,772,571 A | 9/1988 | Scovell et al. | |
| 4,907,054 A * | 3/1990 | Berger ..................... | 257/443 |
| 4,940,553 A | 7/1990 | von Benda | |
| 5,037,200 A | 8/1991 | Kodama | |
| 5,166,758 A | 11/1992 | Ovshinsky et al. | |

(Continued)

FOREIGN PATENT DOCUMENTS

EP 1 308 960 A2 5/2003

(Continued)

OTHER PUBLICATIONS

Fuschillo, et al., "Non-Linear Transport and Switching Properties of Transition Metal Oxides," 6th International Vacuum Congress, Kyoto Japan, Mar. 25-29, 1974, Japanese Journal of Applied Physics Suppl., vol. 2, No. 1, 1974, pp. 817-820, XP002429046, ISSN: 0021-4922.

(Continued)

*Primary Examiner*—Phat X Cao
(74) *Attorney, Agent, or Firm*—Dugan & Dugan, PC

(57) ABSTRACT

In the present invention a metal oxide or nitride compound which is a wide-band-gap semiconductor abuts a silicon, germanium, or alloy of silicon and/or germanium of the opposite conductivity type to form a p-n heterojunction. This p-n heterojunction can be used to advantage in various devices. In preferred embodiments, one terminal of a vertically oriented p-i-n heterojunction diode is a metal oxide or nitride layer, while the rest of the diode is formed of a silicon or silicon-germanium resistor; for example a diode may include a heavily doped n-type silicon region, an intrinsic silicon region, and a nickel oxide layer serving as the p-type terminal. Many of these metal oxides and nitrides exhibit resistivity-switching behavior, and such a heterojunction diode can be used in a nonvolatile memory cell, for example in a monolithic three dimensional memory array.

14 Claims, 5 Drawing Sheets

U.S. PATENT DOCUMENTS

| | | | |
|---|---|---|---|
| 5,273,915 | A | 12/1993 | Hwang et al. |
| 5,311,055 | A | 5/1994 | Goodman et al. |
| 5,774,394 | A | 6/1998 | Chen et al. |
| 5,854,102 | A * | 12/1998 | Gonzalez et al. ............ 438/237 |
| 5,876,788 | A | 3/1999 | Bronner et al. |
| 5,915,167 | A | 6/1999 | Leedy |
| 6,034,882 | A | 3/2000 | Johnson et al. |
| RE37,259 | E | 7/2001 | Ovshinsky |
| 6,369,431 | B1 | 4/2002 | Gonzalez et al. |
| 6,426,891 | B1 | 7/2002 | Katori |
| 6,465,370 | B1 | 10/2002 | Schrems |
| 6,483,734 | B1 | 11/2002 | Sharma et al. |
| 6,534,841 | B1 | 3/2003 | Van Brocklin et al. |
| 6,541,792 | B1 | 4/2003 | Tran et al. |
| 6,707,698 | B2 | 3/2004 | Fricke et al. |
| 6,753,561 | B1 | 6/2004 | Rinerson et al. |
| 6,761,985 | B2 | 7/2004 | Windisch et al. |
| 6,774,458 | B2 | 8/2004 | Fricke et al. |
| 6,778,441 | B2 | 8/2004 | Forbes et al. |
| 6,787,401 | B2 | 9/2004 | Gonzalez et al. |
| 6,798,685 | B2 | 9/2004 | Rinerson et al. |
| 6,815,744 | B1 | 11/2004 | Beck et al. |
| 6,831,854 | B2 | 12/2004 | Rinerson et al. |
| 6,834,008 | B2 | 12/2004 | Rinerson et al. |
| 6,836,421 | B2 | 12/2004 | Rinerson et al. |
| 6,850,429 | B2 | 2/2005 | Rinerson et al. |
| 6,850,455 | B2 | 2/2005 | Rinerson et al. |
| 6,856,536 | B2 | 2/2005 | Rinerson et al. |
| 6,859,382 | B2 | 2/2005 | Rinerson et al. |
| 6,870,755 | B2 | 3/2005 | Rinerson et al. |
| 6,946,719 | B2 | 9/2005 | Petti et al. |
| 6,952,030 | B2 | 10/2005 | Herner et al. |
| 7,116,573 | B2 | 10/2006 | Sakamoto et al. |
| 7,172,840 | B2 | 2/2007 | Chen et al. |
| 7,176,064 | B2 | 2/2007 | Herner et al. |
| 7,215,564 | B2 | 5/2007 | Happ et al. |
| 7,224,013 | B2 | 5/2007 | Herner et al. |
| 7,238,607 | B2 | 7/2007 | Dunton et al. |
| 7,265,049 | B2 | 9/2007 | Herner et al. |
| 7,285,464 | B2 | 10/2007 | Herner |
| 7,307,013 | B2 | 12/2007 | Raghuram et al. |
| 7,307,268 | B2 | 12/2007 | Scheuerlein |
| 7,391,064 | B1 | 6/2008 | Tripsas et al. |
| 7,501,331 | B2 | 3/2009 | Herner |
| 2002/0057594 | A1 | 5/2002 | Hirai |
| 2003/0013007 | A1 | 1/2003 | Kaun |
| 2003/0047727 | A1 | 3/2003 | Chiang |
| 2003/0081446 | A1 | 5/2003 | Fricke et al. |
| 2003/0209971 | A1 | 11/2003 | Kozicki |
| 2004/0002186 | A1 | 1/2004 | Vyvoda et al. |
| 2004/0084743 | A1 | 5/2004 | Vanbuskirk et al. |
| 2004/0095300 | A1 | 5/2004 | So et al. |
| 2004/0159828 | A1 | 8/2004 | Rinerson et al. |
| 2004/0159867 | A1 | 8/2004 | Kinney et al. |
| 2004/0159869 | A1 | 8/2004 | Rinerson et al. |
| 2004/0160798 | A1 | 8/2004 | Rinerson et al. |
| 2004/0160804 | A1 | 8/2004 | Rinerson et al. |
| 2004/0160805 | A1 | 8/2004 | Rinerson et al. |
| 2004/0160806 | A1 | 8/2004 | Rinerson et al. |
| 2004/0160807 | A1 | 8/2004 | Rinerson et al. |
| 2004/0160808 | A1 | 8/2004 | Rinerson et al. |
| 2004/0160812 | A1 | 8/2004 | Rinerson et al. |
| 2004/0160817 | A1 | 8/2004 | Rinerson et al. |
| 2004/0160818 | A1 | 8/2004 | Rinerson et al. |
| 2004/0160819 | A1 | 8/2004 | Rinerson et al. |
| 2004/0161888 | A1 | 8/2004 | Rinerson et al. |
| 2004/0170040 | A1 | 9/2004 | Rinerson et al. |
| 2004/0228172 | A1 | 11/2004 | Rinerson et al. |
| 2004/0245557 | A1 | 12/2004 | Seo et al. |
| 2005/0045919 | A1 | 3/2005 | Kaeriyama et al. |
| 2005/0058009 | A1 | 3/2005 | Yang |
| 2005/0167699 | A1 | 8/2005 | Sugita |
| 2005/0221200 | A1 | 10/2005 | Chen et al. |
| 2005/0226067 | A1 | 10/2005 | Herner |
| 2005/0247921 | A1 | 11/2005 | Lee et al. |
| 2005/0286211 | A1 | 12/2005 | Pinnow et al. |
| 2006/0006495 | A1 | 1/2006 | Herner et al. |
| 2006/0067117 | A1 | 3/2006 | Petti |
| 2006/0094236 | A1 | 5/2006 | Elkins |
| 2006/0098472 | A1 | 5/2006 | Ahn et al. |
| 2006/0128153 | A1 | 6/2006 | Dunton et al. |
| 2006/0157679 | A1 | 7/2006 | Scheuerlein |
| 2006/0164880 | A1 | 7/2006 | Sakamoto et al. |
| 2006/0250836 | A1 * | 11/2006 | Herner et al. ............... 365/148 |
| 2006/0250837 | A1 | 11/2006 | Herner et al. |
| 2006/0268594 | A1 | 11/2006 | Toda |
| 2006/0273298 | A1 | 12/2006 | Petti |
| 2007/0010100 | A1 * | 1/2007 | Raghuram et al. .......... 438/710 |
| 2007/0072360 | A1 | 3/2007 | Kumar et al. |
| 2007/0114508 | A1 | 5/2007 | Herner et al. |
| 2007/0114509 | A1 | 5/2007 | Herner |
| 2007/0228354 | A1 | 10/2007 | Scheuerlein |
| 2007/0236981 | A1 | 10/2007 | Herner |
| 2007/0246743 | A1 | 10/2007 | Cho et al. |
| 2008/0175032 | A1 | 7/2008 | Tanaka et al. |
| 2009/0001342 | A1 | 1/2009 | Schricker et al. |
| 2009/0001343 | A1 | 1/2009 | Schricker et al. |
| 2009/0001344 | A1 | 1/2009 | Schricker et al. |
| 2009/0001345 | A1 | 1/2009 | Schricker et al. |
| 2009/0104756 | A1 | 4/2009 | Kumar |
| 2009/0236581 | A1 | 9/2009 | Yoshida et al. |

FOREIGN PATENT DOCUMENTS

| | | |
|---|---|---|
| EP | 1 484 799 A2 | 12/2004 |
| EP | 1 513 159 A2 | 3/2005 |
| EP | 1 914 806 A1 | 4/2008 |
| GB | 1 284 645 | 8/1972 |
| GB | 1 416 644 | 12/1975 |
| GB | 1416644 | 12/1975 |
| JP | 62042582 | 2/1987 |
| WO | WO 97/41606 A1 | 11/1997 |
| WO | 0049659 | 8/2000 |
| WO | WO 01/69655 A2 | 9/2001 |
| WO | WO 03/079463 A2 | 9/2003 |
| WO | WO 2005/024839 A1 | 3/2005 |
| WO | WO 2006/078505 A2 | 7/2006 |
| WO | WO 2006/121837 A2 | 11/2006 |
| WO | WO 2006/121837 A3 | 11/2006 |
| WO | WO 2007/004843 A1 | 1/2007 |
| WO | WO 2007/038709 | 4/2007 |
| WO | WO 2007/062022 A1 | 5/2007 |
| WO | WO 2007/067448 A1 | 6/2007 |
| WO | WO 2007/072308 A1 | 6/2007 |
| WO | WO 2008/097742 | 8/2008 |

OTHER PUBLICATIONS

Beck et al., "Reproducible Switching Effect in Thin Oxide Films for Memory Applications," Applied Physics Letters, vol. 77, No. 1, Jul. 3, 2000, pp. 139-141, XP00958527, ISSN: 0003-6951.

Jeong et al., "Ultraviolet-enhanced photodiode employing n-ZnO/p-Si structure", Applied Physics Letters, American Institute of Physics, Melville, NY, US, vol. 83, No. 14, Oct. 6, 2003, pp. 2946-2948.

Ozgur et al., "A comprehensive review of ZnO materials and devices", Journal of Applied Physics, American Institute of Physics, New York, US, vol. 98, No. 4, Aug. 30, 2005, pp. 1-103.

Sim et al., "Excellent Resistance Switching Characteristics of Pt/SrTiO3 Schottky Junction for Multi-bit Nonvolatile Memory Application", Electron Devices Meeting, 2005, IEDM Technical Digest, IEEE International Dec. 5, 2005, Piscataway, NJ, USA, pp. 758-761.

Fuschillo et al., "Non-Linear Transport and Switching Properties of Transition Metal Oxides", 1974, Japanese Journal of Applied Physics, Japan Society of Applied Physics, Tokyo, JP, vol. 2, No. 1, pp. 817-820.

Ansari, et al., "Pre- and Post-Threshold Conduction Mechanisms in Thermally Grown Titanium Oxide Films", J. Phys. D. Appl. Phys. 20, (1987), pp. 1063-1066.

Baek et al., "Multi-layer Cross-point Binary Oxide Resistive Memory (OxRRAM) for Post-NAND Storage Application," 2005, pp. 1-4, IEEE.

Baek, I.G.,et al., Highly Scalable Non-volatile Resistive Memory Using Simple Binary Oxide Driven by Asymmetric Unipolar Voltage Pulses, IEDM (2004), (Jan. 2004), 587-590.

Bruyere et al., "Switching and Negative Resistance in Thin Films of Nickel Oxide", Applied Physics Letters, vol. 16, No. 1, Jan. 1, 1970, pp. 40-43.

Hiatt et al., "Bistable Switching in Niobium Oxide Diodes," Applied Physics Letters, Mar. 15, 1965, vol. 6, No. 6, pp. 106-108.

Hwang et al., "Molecular dynamics simulations of nanomemory element based on boron-nitride nanotube-to-peapod transition," Computational Materials Science, 2005, pp. 317-324, 33, Elsevier B.V.

Mine, Lili, "ReRAM with Erase/Read Speed of 3ns, Applicable as Multi-Level cell", Dec. 26, 2006. Nikkei Electronics, <http://techon.nikkeibp.co.jp/english/NEWS_EN/20061226/12591&f>; pp. 1-2.

Pagnia, H., et al., "Bistable switching in Electroformed Metal-Insulator-Metal Devices", Phys. Stat. Sol. A 108 11 (1988), 10-65.

Park, Jae-Wan., et at. "Reproducible resistive switching in nonstoichiometric nickel oxide films grown by rf reactive sputtering for resistive random access memory applications", J. Vac. Sci. Technol. A 23(5). (Sep./Oct. 2005), 1309-1313.

Prince, "Trends in Scaled and Nanotechnology Memories," Sep. 2005, Non-Volatile Memory Symposium, IEEE, Piscataway, NJ USA, pp. 55-61.

Roginskaya et al., "Characterization of Bulk and Surface Composition of $CoxNi1-xOy$ Mixed Oxides for Electrocatalyis", Langmuir, vol. 13, No. 17, 1997, pp. 4621-4627.

Scheuerlein et al., "A 10ns Read and Write Non-Volatile Memory Array Using a Magnetic Tunnel Junction and FET Switch in each Cell," 2000, IEEE International Solid-State Circuits Conference, pp. 1-2.

Seo, S., et al.,"Reproducible resistance switching in polycrystalline NiO films", . Appl. Phys. Lett. vol. 85 No. 23 (2004), (Dec. 6, 2004), 5655-5657.

Seo, S., et al. "Conductivity switching characteristics and reset currents in NiO films", Appl. Phvs. Lett. 86 093509 (2005), 093509;093509-2;093509-3.

Sim et al., "Resistance Switching Characteristics of Polycrystalline Nb205 for Nonvolatile Memory Application", IEEE Electron Device Letters vol. 26, Issue 3, pp. 292-294 (2005), published May 2, 2005.

Windisch, et al., "Synthesis and Characterization of Transparent Conducting Oxide Cobalt-Nickel Spinel Films", Journal of Vacuum Science & Technology A, vol. 19, No. 4, Jul. 2001 pp. 1647-1651.

Malhi et al., "Characteristics and Three-Dimensional Integration of MOSFET's in Small-Grain LPCVD Polycrystalline Silicon", Feb. 1985, IEEE Journal of Solid-State Circuits, vol. sc-20, No. 1, pp. 178-201.

Choi et al., "Resistive Switching Mechanism of TiO2 Thin Films Grown by Atomic-Layer Deposition", 2005, Journal of Applied Physics 98, pp. 033715-1-033715-10.

Shih et al., "Study of Anodic Oxidation of Aluminum in Mixed Acid using a Pulsed Current", 2000, Surface and Coatings Technology 124, pp. 278-285.

F C Eze, "Electroless Deposition of CoO Thin Films", J. Phys. D: Appl. Phys. 32 (1999), pp. 533-540.

Milgram, "Selective Surfaces of Anodic Copper Oxide for Solar Collectors" Jun. 1983, J. Appl. Phys. 54 (6), pp. 3640-3642.

Lu et al., "Study of the Electroless Deposition Process of Ni-P-Based Ternary Alloys", 2003, Journal of The Electrochemical Society, 150 (11), pp. C777-C786.

Osaka et al., "Electroless Nickel Ternary Alloy Deposition on SiO2 for Application to Diffusion Barrier Layer in Copper Interconnect Technology", 2002, Journal of the Electrochemical Society, 149 (11), pp. C573-C578.

Han et al., "The Growth Mechanism of Nickel Oxide Thin Films by Room-Temperature Chemical Bath Deposition", 2006, Journal of The Electrochemical Society, 153 (6), pp. C382-C386.

G.P. Burns, "Titanium Dioxide Dielectric Films Formed by Rapid Thermal Oxidation", Mar. 1, 1989, J. Appl. Phys. 65 (5), pp. 2095-2097.

Fujimoto et al., "TiO2 Anatase Nanolayer on TiN Thin Film Exhibiting High-Speed Bipolar Resistive Switching", 2006, Applied Physics Letters 89, pp. 223509-1-223509-3.

Takano et al., "Mechanism of the Chemical Deposition of Nickel on Silicon Wafers in Aqueous Solution", 1999, Journal of the Electrochemical Society, 146 (4), pp. 1407-1411.

Abouatallah et al., "Characterization of Vanadium Deposit Formation at a Hydrogen Evolving Electrode in Alkaline Media", 2001, Journal of The Electrochemical Society, 148 (9), pp. E357-E363.

Christensen et al., "The Influence of Oxide on the Electrodeposition of Niobium from Alkali Fluoride Melts", May 1994, J. Electrochem. Soc., vol. 141, No. 5, pp. 1212-1220.

Lantelme et al., "Electrodeposition of Tantalum in NaCl-KCl-K2TzF7 Melts", May 1992, J. Electrochem. Soc., vol. 139, No. 5, pp. 1249-1255.

Herner et. al., "Vertical p-i-n. Polysilicon Diode With Antifuse for Stackable Field-Programmable ROM", May 2004 IEEE Electron Device Letters, vol. 25, No. 5, pp. 271-273.

International Search Report and Written Opinion of International Application No. PCT/US2007/007155 mailed Feb. 25, 2008.

International Preliminary Report on Patentability of International Application No. PCT/US2007/007155 mailed Oct. 9, 2008.

\* cited by examiner

HETEROJUNCTION DEVICE COMPRISING A SEMICONDUCTOR AND A RESISTIVITY-SWITCHING OXIDE OR NITRIDE

BACKGROUND OF THE INVENTION

The invention relates to heterojunction devices formed of metal oxides or nitrides and silicon and/or germanium and alloys thereof.

In a vertically oriented p-i-n diode formed in an etched pillar of silicon or germanium, it may be advantageous, for reasons of performance and fabrication, to minimize the height of semiconductor material; yet, to reduce reverse leakage current, it may also be advantageous to maximize the height of the intrinsic region.

Alternative ways to form sharp junctions in such devices, then, will be useful.

SUMMARY OF THE PREFERRED EMBODIMENTS

The present invention is defined by the following claims, and nothing in this section should be taken as a limitation on those claims. In general, the invention is directed to heterojunction devices including a layer of a metal oxide or nitride serving as a p-type or n-type region.

A first aspect of the invention provides for a heterojunction device comprising: a p-n junction; on one side of the p-n junction, a semiconductor element having a first polarity, the semiconductor material comprising silicon, germanium, silicon-germanium, or an alloy of silicon and/or germanium, wherein the semiconductor element is lightly doped or intrinsic; and on the opposite side of the p-n junction, a binary metal oxide or nitride compound, the binary metal oxide or nitride compound having a second polarity opposite the first, and having a resistivity less than 1 megaOhm-cm.

A preferred embodiment of the invention provides for a first memory level of nonvolatile memory cells, each cell comprising: a heterojunction diode, each heterojunction diode comprising: a) a switching element comprising a binary metal oxide or nitride compound, wherein the switching element is switchable between a low-resistance state and a high-resistance state, and wherein, when in the low-resistance state, the switching element is a first terminal of the heterojunction diode having a first polarity; and b) a semiconductor element of silicon, germanium, silicon-germanium, or an alloy thereof, the semiconductor element comprising a second terminal of the heterojunction diode, the second terminal having a second polarity opposite the first, wherein the switching element contacts a lightly-doped or intrinsic region of the semiconductor element.

Another embodiment provides for a monolithic three dimensional memory array comprising: a) a first memory level formed above a substrate, the first memory level comprising: i) a first plurality of substantially parallel, substantially coplanar conductors extending in a first direction; ii) a second plurality of substantially parallel, substantially coplanar conductors extending in a second direction, the second direction different from the first direction, the second conductors above the first conductors; iii) a first plurality of devices, each device comprising a resistivity-switching binary metal oxide or nitride compound and a silicon, germanium, or silicon-germanium alloy resistor of a single conductivity type, each of the first devices disposed between one of the first conductors and one of the second conductors; and b) a second memory level monolithically formed above the first memory level.

Another aspect of the invention provides for a semiconductor device comprising: a first semiconductor layer of heavily doped silicon, germanium, silicon-germanium, or an alloy thereof of a first conductivity type; a semiconductor second layer of silicon, germanium, silicon-germanium, or an alloy thereof, the second semiconductor layer above and in contact with the first semiconductor layer, wherein the second semiconductor layer is intrinsic or lightly doped to the first conductivity type; and a conductive binary metal oxide or nitride compound above and in contact with the second semiconductor layer, wherein a p-n junction is formed between the second semiconductor layer and the conductive binary metal oxide or nitride compound.

Still another preferred embodiment provides for a MOS device comprising: a semiconductor channel region comprising silicon, germanium, silicon-germanium, or a silicon-germanium alloy; a source region comprising a conductive binary metal oxide or nitride compound; and a drain region comprising the conductive binary metal oxide or nitride compound.

Another aspect of the invention provides for a nonvolatile memory cell comprising: a resistivity-switching binary metal oxide or nitride compound; and a silicon, germanium, or silicon-germanium alloy resistor of a single conductivity type.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

A class of binary metal oxide or nitride compounds is known which can electrically behave as relatively wide-band gap semiconductors. A binary metal oxide or nitride compound is a compound including two elements, where the first is a metal and the second is oxygen or nitrogen. Some of these binary metal oxide or nitride compounds exhibit resistivity-switching behavior, meaning that these materials can be reversibly switched between two or more stable resistivity states. The states include at least a high-resistivity state and a low-resistivity state, wherein the difference in resistivity between the high-resistivity state and the low-resistivity state is at least a factor of three. Preferred resistivity-switching binary metal oxide or nitride compounds include $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, $Al_xN_y$, where x and y range between 0 and 1. Examples are the stoichiometric compounds NiO, $Nb_2O_5$, $TiO_2$, $HfO_2$, $Al_2O_3$, $MgO_x$, CoO, $CrO_2$, VO, ZnO, ZrO, BN, and AlN, but nonstoichiometric compounds may be preferred.

Use of these resistivity-switching binary metal oxide or nitride compounds in a nonvolatile memory array is described in Herner et al., U.S. patent application Ser. No. 11/395,995, "Nonvolatile Memory Cell Comprising a Diode and a Resistivity-Switching Material," filed Mar. 31, 2006; which is a continuation-in-part of Herner et al., U.S. patent application Ser. No. 11/125,939, "Rewriteable Memory Cell Comprising a Diode and a Resistance-Switching Material," filed May 9, 2005 and hereinafter the '939 application, both hereby incorporated by reference.

Figure 1:
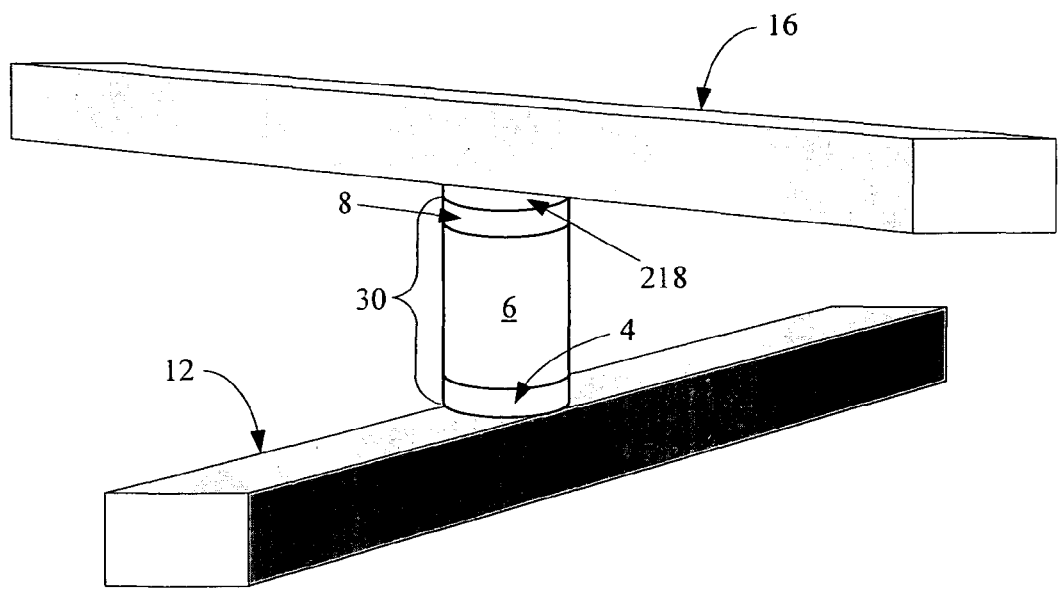
FIG. 1 is a perspective view of a memory cell including a diode and a resistance-switching element.

In a preferred embodiment of the '939 application, the nonvolatile memory cell shown in FIG. 1 includes a diode 30 and a resistance-switching element 218, the two arranged electrically in series between bottom conductor 12 and top conductor 16. Resistance-switching element 218 includes a layer of one of the resistivity-switching binary metal oxides or nitrides. In this embodiment, diode 30 includes a bottom heavily doped n-type region 4, a middle intrinsic region 6, and a top heavily doped region 8. These regions are all formed of silicon, germanium, or an alloy of silicon and/or germanium.

Resistance-switching element 218 can be switched between at least two stable resistance states. When resistance-switching element 218 is in a high-resistance state, very little current flows through the memory cell when a read voltage is applied between top conductor 16 and bottom conductor 12. When resistance-switching element 218 is switched to a low-resistance state, significantly more current flows at the same applied read voltage. The data state of the memory cell can be stored in the resistance state of the resistance-switching element. For example, a high-resistance state can correspond to a data '0' while a low-resistance state corresponds to a data '1', or vice versa. The difference in read current allows the data states to be distinguished.

Figure 2:
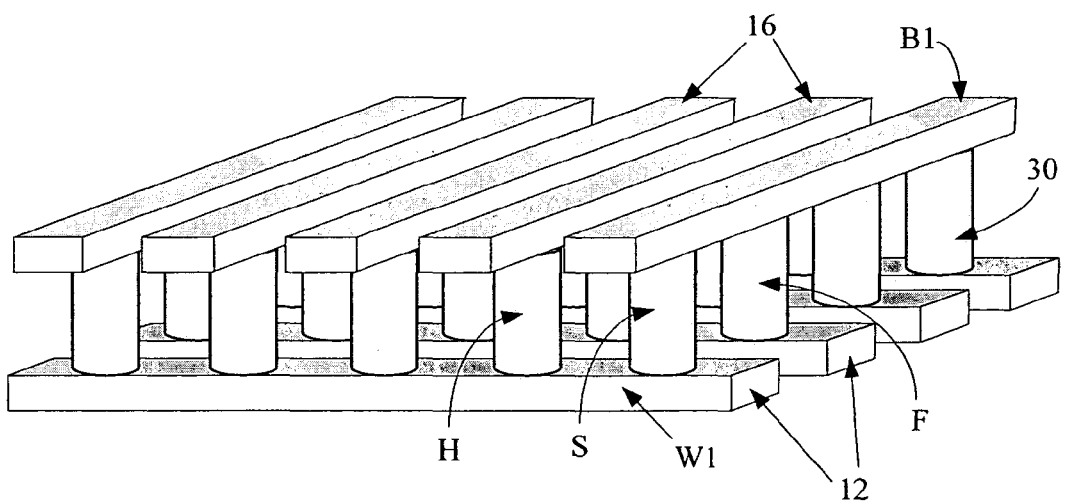
FIG. 2 is a perspective view of a portion of a memory level of cells like the memory cell of FIG. 1 or FIG. 3.

FIG. 2 shows a portion of a first memory level of memory cells like the cell of FIG. 1. Such a memory level can be formed above an appropriate substrate, such as a semiconductor substrate, and additional memory levels can be formed above the first.

Diodes 30 provide electrical isolation between adjacent cells in such a memory level. A wire is ohmic, conducting with equal ease in both directions, and with current increasing linearly with voltage. In contrast, a diode is a non-ohmic device. A diode acts as a one-way valve, conducting current more readily in one direction than in the opposite direction. A diode has a turn-on voltage; below this turn-on voltage, little or no current flows. Once the turn-on voltage is reached, current flow increases rapidly.

In an array like that pictured in FIG. 2, selected cell S is programmed by applying voltage between bitline B1 and wordline W1. Other memory cells that share bitline B1, such as cell F, and cells that share wordline W1, such as cell H, will unavoidably be exposed to voltage at the same time.

If appropriate voltages are chosen for selected and unselected bitlines (top conductors 16) and wordlines (bottom conductors 12), the presence of diodes 30 make it possible to provide a high programming voltage to a selected memory cell in this array without inadvertently programming cells which share a wordline or bitline with the selected cell.

A low-resistivity state for the resistivity-switching binary metal oxides or nitrides will be described as a set state, and a high-resistivity state as a reset state. If a material is placed in more than two resistivity states, the highest resistivity state will be called the reset state, while the other states will be alternative set states. A set pulse places a material into a lower resistivity set state, while a reset pulse places the material in a higher resistivity reset state. The terms set and reset voltage and set and reset current will be used as well. It has been found that, when in a set state, these switchable materials behave as wide-band-gap semiconductors. Some, such as $Ni_xO_y$, are p-type semiconductors, while others are n-type semiconductors.

In the present invention, a binary metal oxide or nitride compound which is a wide-band-gap semiconductor is formed adjacent to an intrinsic or doped conventional semiconductor material, such as silicon, germanium, or an alloy of silicon and/or germanium, forming a p-n heterojunction. This heterojunction can be used in a variety of devices.

Figure 3:
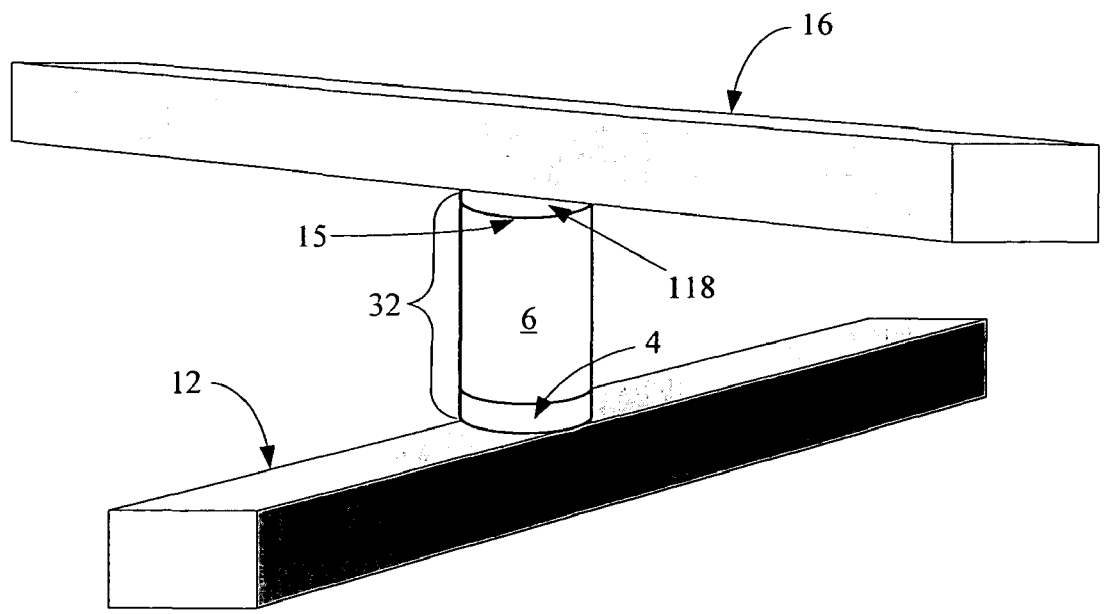
FIG. 3 is a perspective view of a heterojunction diode formed according to an embodiment of the present invention.

For example, FIG. 3 shows a memory cell formed according to a preferred embodiment of the present invention. This memory cell includes a heavily doped n-type silicon region 4, an intrinsic silicon region 6, and a nickel oxide layer 118. It will be understood that in this discussion "nickel oxide" refers to both stoichiometric and nonstoichiometric oxides of nickel, that "niobium oxide" refers both to stoichiometric $Nb_2O_5$ and to nonstoichiometric mixes, and so on. As compared to the cell of FIG. 1, in the cell of FIG. 3, heavily doped p-type silicon region 8 is omitted. Intrinsic silicon will never be perfectly electrically neutral, and in general has defects which cause it to behave as if lightly n-doped. Nickel oxide is electrically a p-type semiconductor. When nickel oxide is in the set state, then, the junction 15 between intrinsic region 6 and nickel oxide layer 118 is a p-n junction, and regions 4 and 6 and nickel oxide layer 118 together behave as a heterojunction diode 32. Diode 32 is arranged in series between bottom conductor 12 and top conductor 16. When nickel oxide is in the reset state, silicon regions 4 and 6 and nickel oxide layer 118 together behave as a high-resistance resistor.

The memory cell of FIG. 3 operates very much like the memory cell of FIG. 1, and affords some important advantages over it. When the device of FIG. 3 is used as a memory cell in an array, it has proven to be advantageous both a) to minimize the thickness of polycrystalline semiconductor material making up the diode and b) for a given diode height, to maximize the thickness of the intrinsic region.

As described in Herner et al., U.S. patent application Ser. No. 11/148,530, "Nonvolatile Memory Cell Operating by Increasing Order in Polycrystalline Semiconductor Material," filed Jun. 8, 2005, hereinafter the '530 application and hereby incorporated by reference, when deposited amorphous silicon is crystallized adjacent only to materials with which it has a high lattice mismatch (silicon dioxide and titanium nitride, for example), the resulting polycrystalline silicon (which will be described in this discussion as polysilicon) tends to include many defects in its crystalline structure, which cause this high-defect polysilicon to be relatively high-resistivity as formed. A vertically oriented p-i-n diode, like diode 30 of FIG. 1, when formed of high-defect polysilicon, initially permits very low current flow at an applied read voltage. After application of a relatively large pulse across this diode, however, it behaves like a much higher-quality diode. The pulse apparently improves the degree of crystalline order of the polysilicon making up the diode without causing a harmful degree of dopant diffusion. As described in Herner et al., U.S. patent application Ser. No. 11/015,824, "Nonvolatile Memory Cell Comprising a Reduced Height Vertical Diode," filed Dec. 17, 2004 and hereby incorporated by reference, it has been found that reducing the height of the diode reduces the programming voltage required to transform the high-defect polysilicon from the high-resistivity to the low-resistivity state.

In preferred embodiments, the diodes 30 of FIG. 1 and 32 of FIG. 3 are formed by patterning and etching a deposited semiconductor layerstack, then filling gaps between them with dielectric. High-aspect-ratio features are more difficult to etch and high-aspect-ratio gaps are more difficult to fill, so reducing pillar height makes fabrication easier and more reliable.

It has been noted that a diode acts as a one-way valve, preferentially conducting in one direction. A p-i-n diode like diode 30 of FIG. 1 or diode 32 of FIG. 3 should allow minimal current flow when the diode is under reverse bias. This leakage current through diodes under reverse bias in a cross-point array wastes power. Leakage current is minimized by increasing the thickness of intrinsic region 6.

By omitting heavily doped p-type region 8 of FIG. 1, the cell of FIG. 3 allows the semiconductor pillar (regions 4 and 6) to be shorter for the same intrinsic region thickness, or, alternatively, allows for the same semiconductor height with an increased intrinsic region thickness, as compared to the cell of FIG. 1.

The memory cell of FIG. 3 is a nonvolatile memory cell comprising a resistivity-switching binary metal oxide or nitride compound; and a silicon, germanium, or silicon-germanium alloy resistor of a single conductivity type, made up of heavily doped region 4 and intrinsic region 6.

Figure 4A:
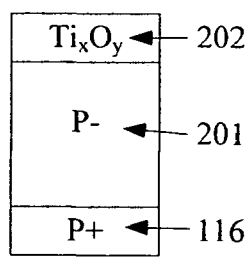
FIGS. 4a and 4b are cross-sectional views of heterojunction diodes formed according to alternative embodiments of the present invention.
Figure 4B:
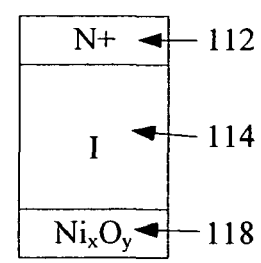

The cell of FIG. 3 showed vertically oriented p-i-n heterojunction diode 32 with nickel oxide layer 118 serving as the p-region. As noted, some of the binary metal oxides or nitrides mentioned earlier are p-type, while others, such as titanium oxide, are n-type. Clearly other configurations are possible. For example, FIG. 4a shows a p-i-n diode with heavily doped p-type region 116 and intrinsic or lightly doped p-type region 201, with titanium oxide layer 202 serving as the n-type region to complete heterojunction diode 34. FIG. 4b shows a p-i-n diode like that of FIG. 3, with nickel oxide layer 118 serving as the p-type region, though with nickel oxide layer 118 formed below, rather than above, intrinsic region 114, and with n-type region 112 at the top of the diode. Many other variations can be imagined, and the other binary metal oxides or nitrides can be substituted for nickel oxide layer 118 or titanium oxide layer 202 as appropriate.

Figure 5:
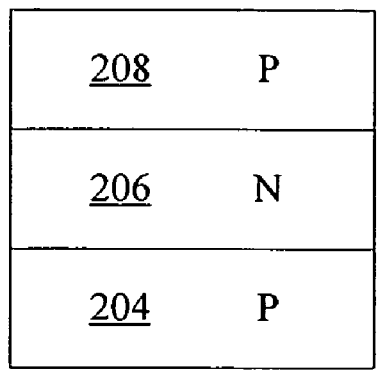
FIG. 5 is cross-sectional view of a P-N-P bipolar junction transistor formed according to yet another embodiment of the present invention.

Other devices may be formed employing a p-n heterojunction between a metal oxide or nitride and doped or intrinsic silicon, germanium, or an alloy of silicon and/or germanium. FIG. 5 shows a p-n-p bipolar heterojunction transistor. The heavily doped p-type collector 204 and lightly doped n-type base 206 are both formed of doped silicon, which may be either monocrystalline silicon or polysilicon. The p-type emitter region 208 is formed of nickel oxide.

Figure 6:
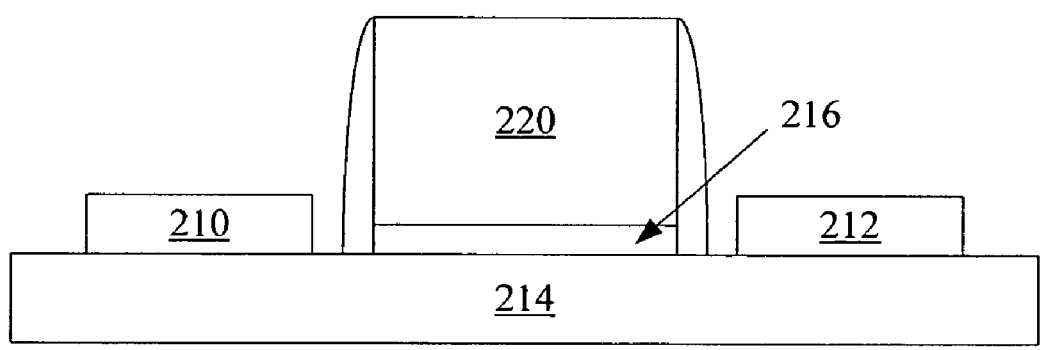
FIG. 6 is a cross-sectional view of a MOS device formed according to another embodiment of the present invention.

FIG. 6 shows a MOS transistor in which nickel oxide is used to form p-type source and drain regions 210 and 212. Channel region 214 is a conventional semiconductor material, for example lightly doped n-type silicon. Gate oxide 216 may be silicon dioxide or some other appropriate dielectric, and control gate 220 is heavily doped polysilicon or some other conductive material. This device provides the advantage of a very sharp junction between the source/drain regions 210/212 and the channel region 214, and avoids the danger of unwanted diffusion of dopants from the source/drain regions 210/212 to the channel region 214. This device can be formed with channel region 214 in a monocrystalline semiconductor substrate, such as a silicon wafer or a silicon-on-insulator substrate, or can be formed in a polysilicon film as a thin film device. The MOS device could be formed as a memory cell, and multiple memory levels of such devices can be stacked to form a monolithic three dimensional memory array.

Each of the devices described is a heterojunction device comprising a p-n junction. On one side of the p-n junction is a semiconductor element having a first polarity, the semiconductor material comprising silicon, germanium, silicon-germanium, or an alloy of silicon and/or germanium, wherein the semiconductor element is lightly doped or intrinsic; and on the opposite side of the p-n junction is a binary metal oxide or nitride compound, the binary metal oxide or nitride compound having a second polarity opposite the first, and having a resistivity less than 1 megaOhm-cm, preferably less than about 1 kiloOhm-cm, more preferably less than about 1 microOhm-cm.

FABRICATION EXAMPLE

A detailed example will be provided describing fabrication of a first memory level of a monolithic three dimensional memory array comprising memory cells like the memory cell of FIG. 3. This example is provided for clarity, but is intended to be non-limiting. Details will be provided, but it will be understood that many of the materials, steps, and conditions described here can be changed, omitted, or augmented while the results fall within the scope of the invention.

Fabrication details provided in the '939 and '530 applications earlier incorporated, in the Herner et al. Ser. No. 11/395, 995 application and in Herner et al., U.S. Pat. No. 6,952,030, "High-Density Three-Dimensional Memory Cell," may prove to be helpful in fabrication of the memory level to be described. To avoid obscuring the invention, not all of this detail will be described, but it will be understood that no teaching of these applications and patents is intended to be excluded.

Figure 7A:
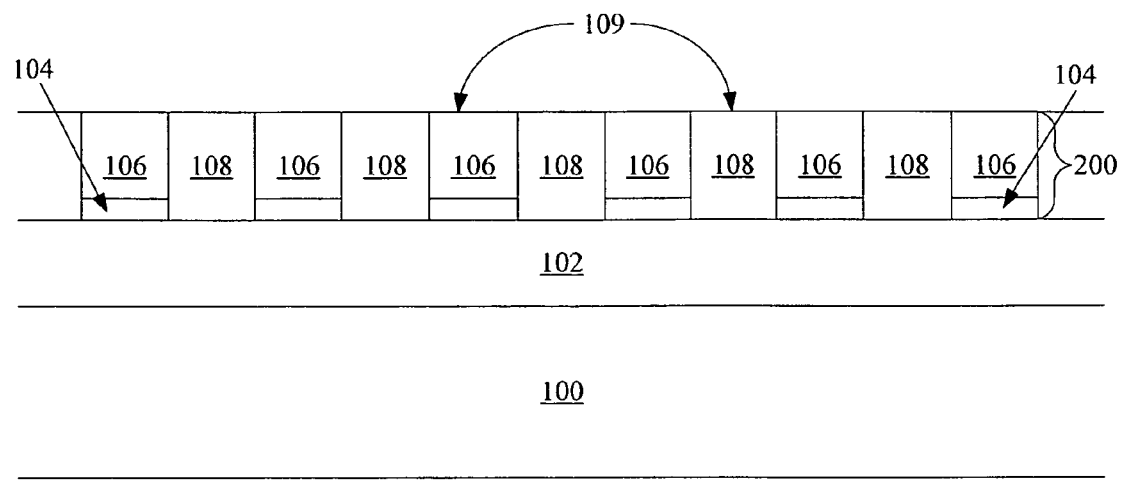
FIGS. 7a-7d are cross-sectional views illustrating stages of fabrication of a monolithic three dimensional memory array formed according to a preferred embodiment of the present invention.

Turning to FIG. 7a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate 100 and insulator 102. An adhesion layer 104 may be included between the insulating layer 102 and the conducting layer 106. A preferred material for the adhesion layer 104 is titanium nitride, though other materials may be used, or this layer may be omitted. Adhesion layer 104 can be deposited by any conventional method, for example by sputtering.

The thickness of adhesion layer 104 can range from about 20 to about 500 angstroms, and is preferably between about 100 and about 400 angstroms, most preferably about 200 angstroms. Note that in this discussion, "thickness" will denote vertical thickness, measured in a direction perpendicular to substrate 100.

The next layer to be deposited is conducting layer 106. Conducting layer 106 can comprise any conducting material known in the art, such as doped semiconductor, metals such as tungsten, or conductive metal silicides; in a preferred embodiment, conducting layer 106 is tungsten.

Once all the layers that will form the conductor rails have been deposited, the layers will be patterned and etched using any suitable masking and etching process to form substantially parallel, substantially coplanar conductors 200, shown in FIG. 7a in cross-section. In one embodiment, photoresist is deposited, patterned by photolithography and the layers etched, and then the photoresist removed, using standard process techniques such as "ashing" in an oxygen-containing plasma, and strip of remaining polymers formed during etch in a conventional liquid solvent such as those formulated by EKC.

Next a dielectric material 108 is deposited over and between conductor rails 200. Dielectric material 108 can be any known electrically insulating material, such as silicon oxide, silicon nitride, or silicon oxynitride. In a preferred embodiment, silicon oxide is used as dielectric material 108. The silicon oxide can be deposited using any known process, such as chemical vapor deposition (CVD), or, for example, high-density plasma CVD (HDPCVD).

Finally, excess dielectric material 108 on top of conductor rails 200 is removed, exposing the tops of conductor rails 200 separated by dielectric material 108, and leaving a substantially planar surface 109. The resulting structure is shown in FIG. 7a. This removal of dielectric overfill to form planar surface 109 can be performed by any process known in the art, such as etchback or chemical mechanical polishing (CMP). For example, the etchback techniques described in Raghuram et al., U.S. application Ser. No. 10/883,417, "Nonselective Unpatterned Etchback to Expose Buried Patterned Features," filed Jun. 30, 2004 and hereby incorporated by reference in its entirety, can advantageously be used.

Alternatively, conductor rails can be formed by a damascene process, in which oxide is deposited, trenches are etched in the oxide, then the trenches are filled with conductive material to create the conductor rails.

Figure 7B:
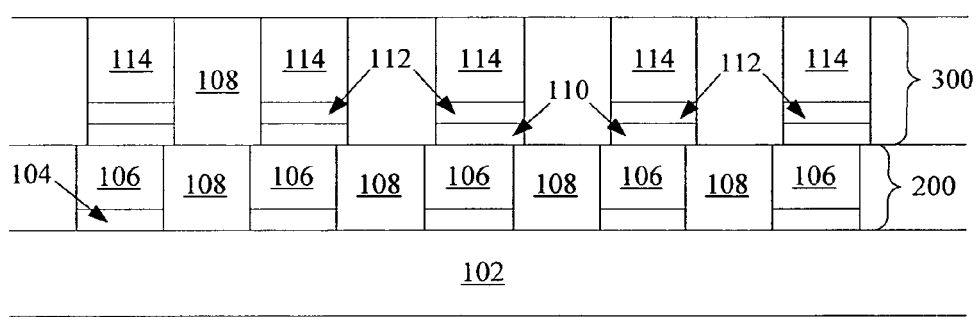

Next, turning to FIG. 7b, semiconductor pillars will be formed above completed conductor rails 200. (To save space substrate 100 is omitted in FIG. 7b and subsequent figures; its presence will be assumed.) In preferred embodiments a barrier layer 110, preferably of titanium nitride, is deposited on planar surface 109 to prevent formation of tungsten silicide, which may damage the diode about to be formed.

Semiconductor material that will be patterned into pillars is deposited. The semiconductor material can be, for example, silicon, germanium, or alloys of silicon and/or germanium. The present example will describe the use of silicon, though it will be understood that other materials may be used instead.

In this example, bottom heavily doped region 112 is heavily doped n-type silicon. In a most preferred embodiment, heavily doped region 112 is deposited and doped with an n-type dopant such as phosphorus by any conventional method, preferably by in situ doping. This layer is preferably between about 200 and about 800 angstroms.

Next intrinsic silicon region 114 is formed. In some embodiments a subsequent planarization step will remove some silicon, so an extra thickness is deposited. If the planarization step is performed using a conventional CMP method, about 800 angstroms of thickness may be lost (this is an average; the amount varies across the wafer. Depending on the slurry and methods used during CMP, the silicon loss may be more or less.) If the planarization step is performed by an etchback method, only about 400 angstroms of silicon or less may be removed. Depending on the planarization method to be used and the desired final thickness, between about 800 and about 3800 angstroms of undoped silicon is deposited by any conventional method; preferably between about 1300 and about 2300 angstroms; most preferably between about 1600 and about 2000 angstroms. If desired, the silicon can be lightly doped with an n-type dopant.

Next regions 114 and 112 are patterned and etched into pillars 300. Pillars 300 should have about the same pitch and about the same width as conductors 200 below, such that each pillar 300 is formed on top of a conductor 200. Some misalignment can be tolerated.

The photolithography techniques described in Chen, U.S. patent application Ser. No. 10/728,436, "Photomask Features with Interior Nonprinting Window Using Alternating Phase Shifting," filed Dec. 5, 2003; or Chen, U.S. patent application Ser. No. 10/815,312, "Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

A dielectric material 108, for example an HDP oxide such as silicon dioxide, is deposited over and between pillars 300, filling gaps between them. Next the dielectric material on top of the pillars 300 is removed, exposing the tops of pillars 300 separated by dielectric material 108, and leaving a substantially planar surface. This removal of dielectric overfill and planarization can be performed by any process known in the art, such as CMP or etchback. For example, the etchback techniques described in Raghuram et al. can be used. At this point each pillar 300, including silicon regions 112 and 114, is a resistor. The resulting structure is shown in FIG. 7b.

Figure 7C:
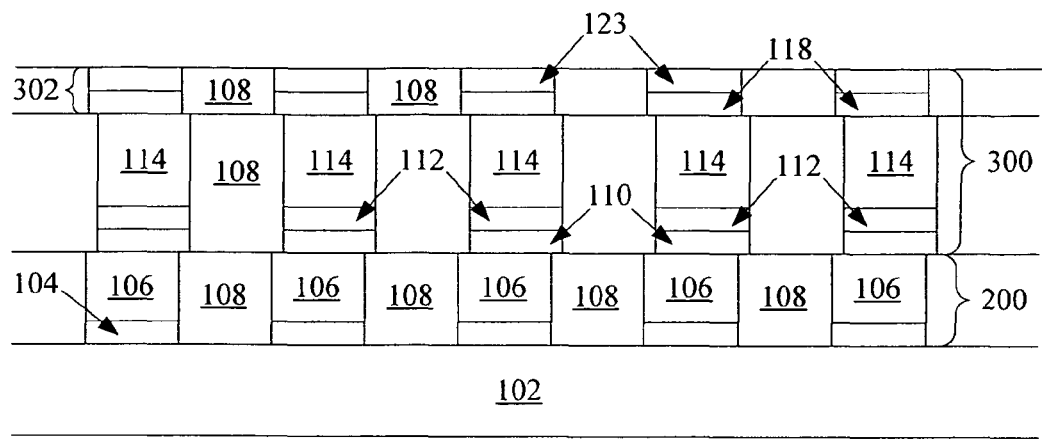

Turning to FIG. 7c, a layer 118 of a binary metal oxide or nitride compound is deposited on the planarized surface above pillars 300. This layer is preferably between about 50 and about 400 angstroms, for example between about 100 and about 200 angstroms. Layer 118 can be any of the materials described earlier, and is preferably formed of a metal oxide or nitride having including exactly one metal which exhibits resistance switching behavior; preferably a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, $Al_xN_y$. For simplicity this discussion will describe the use of nickel oxide in layer 118. It will be understood, however, that any of the other materials described can be used.

Next in preferred embodiments barrier layer 123 is deposited on nickel oxide layer 118. Layer 123 is preferably titanium nitride, though some other appropriate conductive barrier material may be used instead. An advantage of barrier layer 123 is that it allows an upcoming planarization step to be performed on barrier layer 123 rather than nickel oxide layer 118. In some embodiments, layer 123 may be omitted.

Layers 123 and 118 are patterned and etched to form short pillars 302, ideally directly on top of pillars 300 formed in the previous pattern and etch step. Some misalignment may occur, as shown in FIG. 7c, and can be tolerated. The photomask used to pattern pillars 300 may be reused in this patterning step. Nickel oxide layer 118 can be etched by any conventional method, such as a sputter etch, or may be etched using the chemical etch method described in Raghuram et al., U.S. patent application Ser. No. 11/179,423, "Method of Plasma Etching Transition Metals and Their Compounds," filed Jun. 11, 2005 and hereby incorporated by reference. If nickel oxide layer 118 is sputter etched, a thickness of overlying layer 123 will be removed. The thickness of layer 123 should be adjusted accordingly. Gaps between short pillars 302 are filled with dielectric material 108, then another planarization step, for example by CMP or etchback, removes dielectric overfill and exposes tops of pillars 300, which now include short pillars 302, as shown in FIG. 7c.

Figure 7D:
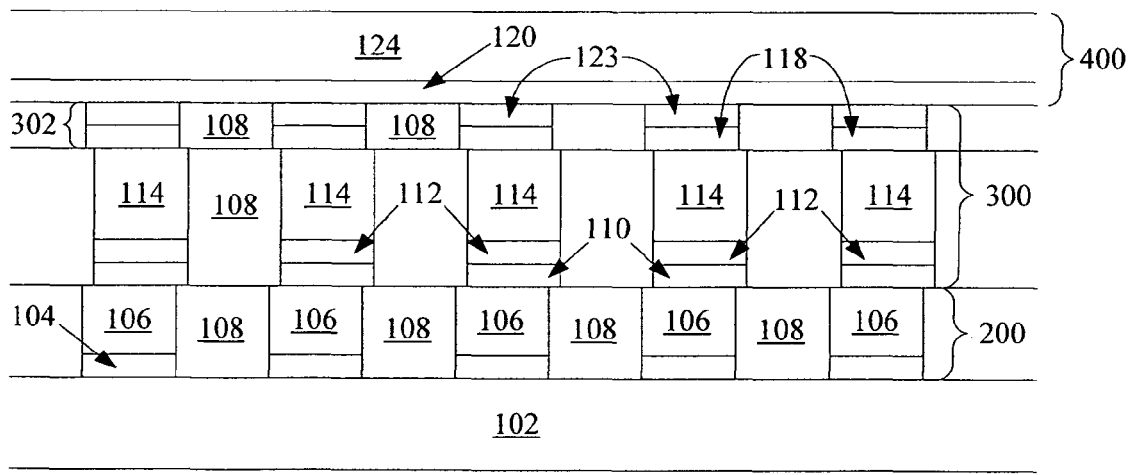

Turning to FIG. 7d, next a conductive material or stack is deposited to form the top conductors 400. In a preferred embodiment, titanium nitride barrier layer 120 is deposited next, followed by tungsten layer 124. Top conductors 400 can be patterned and etched in the same manner as bottom conductors 200. Overlying second conductors 400 will preferably extend in a different direction from first conductors 200, preferably substantially perpendicular to them. Each pillar 300 should be formed at the intersection of a top conductor 400 and a bottom conductor 200, vertically disposed between them. Some misalignment can be tolerated. A dielectric material (not shown) is deposited over and between conductors 400.

The resulting structure, shown in FIG. 7d, is a bottom or first story of memory cells. Each memory cell comprises a heterojunction diode, a portion of one of bottom conductors 200, and a portion of one of top conductors 400. Each cell also comprises a switching element comprising a layer of a binary metal oxide or nitride compound. In operation, the resistance state of the switching element of each memory cell is switched by applying voltage or flowing current between one of the bottom conductors 400 and one of the top conductors 400 through the heterojunction diode of the memory cell. The cells are rewriteable memory cells. The array further comprises circuitry adapted to individually switch the resistivity-switching binary metal oxide or nitride compound of each memory cell between a stable low-resistivity state and a stable high-resistivity state.

Additional memory levels can be monolithically formed above this first memory level. In some embodiments, conductors can be shared between memory levels; i.e. top conductor 400 would serve as the bottom conductor of the next memory level. In this case a CMP step would remove dielectric overfill, exposing top conductors 400 at a substantially planar surface. In other embodiments, an interlevel dielectric is formed above the first memory level of FIG. 7d, its surface planarized without exposing conductors 400, and construction of a second memory level begins on this planarized interlevel dielectric, with no shared conductors. Once fabrication of all memory levels has been completed, a crystallizing anneal may be performed to crystallize the silicon of the diodes on all memory levels.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Each memory level in the monolithic three dimensional memory array formed in the example provided is a first memory level of nonvolatile memory cells, each cell comprising: a heterojunction diode, each heterojunction diode comprising: a) a switching element comprising a binary metal oxide or nitride compound, wherein the switching element is switchable between a low-resistance state and a high-resistance state, and wherein, when in the low-resistance state, the switching element is a first terminal of the heterojunction diode having a first polarity; and b) a semiconductor element of silicon, germanium, silicon-germanium, or an alloy thereof, the semiconductor element comprising a second terminal of the heterojunction diode, the second terminal having a second polarity opposite the first, wherein the switching element contacts a lightly-doped or intrinsic region of the semiconductor element.

Many details of fabrication of this memory level, or of its structure, can be varied, and it is impractical to detail all possible variations. A few preferred alternatives will be discussed, however.

As described in the '939 application, nickel oxide layer 118 can be formed as part of the top conductors 400, or even as an unpatterned blanket layer between the top conductors 400 and the pillars 300. In general, nickel oxide is formed in a relatively high-resistivity state. If nickel oxide layer 118 is sufficiently high-resistivity, it will not provide an unwanted conductive path shorting adjacent memory cells. When programming voltage is applied to switch the nickel oxide 118 to a low-resistivity state, resistivity switching only takes place in a localized switching region between each pillar 300 and top conductor 400, and only this small region becomes low-resistivity. The remainder of the layer remains in the original high-resistivity state.

In the example provided, nickel oxide layer 118 and its associated barrier layer is patterned and etched in a separate step from the pattern and etch step that forms the pillars comprising silicon regions 114 and 112. If desired, these could be patterned and etched using a single patterning step. For example, nickel oxide layer could be used as a hard mask during etch of the semiconductor pillar below.

In another alternative embodiment, it may be desirable to form the silicon resistor (regions 112 and 114) of low-defect polysilicon crystallized adjacent to a silicide which provides an advantageous crystallization template, such as titanium silicide. As described in the '530 application, and in Herner, U.S. patent application Ser. No. 10/954,510, "Memory Cell Comprising a Semiconductor Junction Diode Crystallized Adjacent to a Silicide," filed Sep. 29, 2004 and hereby incorporated by reference, when amorphous deposited silicon is crystallized adjacent to, for example, titanium silicide, the polysilicon is lower in defects and lower resistivity. In contrast, when crystallized adjacent only to materials with which it has a high lattice mismatch, the resulting polysilicon is higher resistivity. Application of a relatively high-amplitude electrical pulse through the polysilicon changes the high-defect, high-resistivity polysilicon, leaving it lower resistivity. When formed adjacent to a silicide, the high-amplitude pulse is not required to reduce the resistivity of this high-resistivity polysilicon.

To crystallize polysilicon regions 112 and 114 adjacent to a layer of titanium silicide, regions 112 and 114 are deposited, patterned, and etched as described, gaps between them filled, and top surfaces exposed by planarization. Next a thin layer of titanium and thin layer of titanium nitride are deposited. A low-temperature anneal reacts the titanium with the silicon of each pillar, forming a disk of titanium silicide at the top of each pillar. A wet etch removes the titanium nitride layer and strips away any unreacted titanium. Next a higher temperature anneal crystallizes silicon layers 114 and 112, which will be low-defect, low-resistivity polysilicon. The titanium silicide is then removed in a wet etch, and fabrication continues as in embodiment described above, with deposition of nickel oxide layer 118.

Embodiments of the present invention have been described in the context of memory cells, and of a monolithic three dimensional memory array. It will be understood, however, that the invention is limited neither to memory nor to monolithically stacked devices, and can be used to advantage in other contexts.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A memory cell comprising a heterojunction diode comprising:
   a semiconductor element comprising:
      a first semiconductor layer of heavily doped silicon, germanium, silicon-germanium, or an alloy thereof of a first conductivity type; and
      a second semiconductor layer of silicon, germanium, silicon-germanium, or an alloy thereof, the second semiconductor layer above and in contact with the first semiconductor layer, wherein the second semiconductor layer is intrinsic or lightly doped to the first conductivity type; and
   a switching element comprising a layer of a conductive binary metal oxide or nitride compound above and in contact with the second semiconductor layer, wherein a p-n junction is formed between the second semiconductor layer and the layer of the conductive binary metal oxide or nitride compound,
   wherein the switching element has a first polarity and the second semiconductor layer has a second polarity opposite the first polarity.

2. The memory cell of claim 1 wherein the first and second semiconductor layers are polycrystalline.

3. The memory cell of claim 1 wherein the conductive binary metal oxide or nitride has a resistivity less than one megaOhm-cm.

4. The memory cell of claim 1 wherein the binary metal oxide or nitride compound is selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, $Al_xN_y$.

5. The semiconductor device of claim 4 wherein the binary metal oxide or nitride compound is NiO and the first conductivity type is n-type.

6. The memory cell of claim 1, wherein the binary metal oxide or nitride compound is selected from the group consisting of NiO, $Nb_2O_5$, $TiO_2$, $HfO_2$, $Al_2O_3$, $MgO_x$, CoO, $CrO_2$, VO, ZnO, ZrO, BN, and AlN.

7. The memory cell of claim 1, wherein the binary metal oxide or nitride compound is switchable between at least a stable high-resistivity state and a stable low-resistivity state, wherein the difference in resistivity between the high-resistivity state and the low-resistivity state is at least a factor of three.

8. The heterojunction device of claim 1, wherein the heterojunction diode is a p-i-n diode.

9. The memory cell of claim 1, wherein the heterojunction diode is vertically oriented.

10. The memory cell of claim 1, wherein the semiconductor element is in the form of a pillar.

11. The heterojunction device of claim 1, wherein at least a portion of the semiconductor element is doped with an n-type dopant.

12. The memory cell of claim 1, wherein at least a portion of the semiconductor element is doped with a p-type dopant.

13. The memory cell of claim 1, wherein the resistivity of the binary metal oxide or nitride compound is less than about 1 kiloOhm-cm.

14. The memory cell of claim 1, wherein the resistivity of the binary metal oxide or nitride compound is less than about 1 microOhm-cm.

* * * * *